United States Patent
Yokogawa et al.

(10) Patent No.: US 6,551,445 B1
(45) Date of Patent: Apr. 22, 2003

(54) PLASMA PROCESSING SYSTEM AND METHOD FOR MANUFACTURING A SEMICONDUCTOR DEVICE BY USING THE SAME

(75) Inventors: Ken'etsu Yokogawa, Tsurugashima (JP); Yoshinori Momonoi, Kokubunji (JP); Nobuyuki Negishi, Kokubunji (JP); Masaru Izawa, Hino (JP); Shinichi Tachi, Sayama (JP)

(73) Assignee: Hitachi, Ltd., Tokyo (JP)

( * ) Notice: Subject to any disclaimer, the term of this patent is extended or adjusted under 35 U.S.C. 154(b) by 1 day.

(21) Appl. No.: 09/665,045

(22) Filed: Sep. 19, 2000

(30) Foreign Application Priority Data

Sep. 13, 2000 (JP) .......................... 2000-278160

(51) Int. Cl.$^7$ ........................... H05H 1/00; H01L 21/00
(52) U.S. Cl. ..................... 156/345.46; 156/345.47; 118/723 E; 204/298.37
(58) Field of Search ................ 156/345; 118/723 MR, 118/723 MA, 723 E; 204/298.37

(56) References Cited

U.S. PATENT DOCUMENTS

| | | | | |
|---|---|---|---|---|
| 5,032,202 A | * | 7/1991 | Tsai et al. ............... | 156/345 |
| 5,611,864 A | * | 3/1997 | Kimura et al. .......... | 118/723 MR |
| 5,891,252 A | | 4/1999 | Yokogawa et al. ...... | 118/723 E |
| 6,039,836 A | * | 3/2000 | Dhindsa et al. ......... | 156/345 |

FOREIGN PATENT DOCUMENTS

JP  9-321031  12/1997

OTHER PUBLICATIONS

M. Sekine et al, Highly Selective Etching of Phosphorus–Doped Polycrystalline Silicon at Low Wafer Temperature Employing Magentron Plasma, 1988 Dry Process Symposium, II–4, pp. 54–57.

* cited by examiner

Primary Examiner—Thi Dang
(74) Attorney, Agent, or Firm—Mattingly, Stanger & Malur, P.C.

(57) ABSTRACT

A parallel plate ECR plasma processing system is able to extend a plasma density region capable of keeping a continuous, uniform state. In this system, a first magnetic field-forming means formed of a solenoid coil and a second magnetic field-forming means are provided so that a the distribution of a direction of a magnetic line of flux on the surface of a planar plate is controlled by a combined magnetic field from the first and second magnetic field-forming means thereby controlling the distribution in degree of the interactions of the magnetic field and an electromagnetic wave. This control ensures the uniformity of a plasma under high density plasma formation conditions, thus enabling one to form a continuous plasma over a wide range of low to high densities. Thus, there can be realized a plasma processing system that ensures processing under wide plasma conditions including high-speed processing under high density conditions.

32 Claims, 9 Drawing Sheets

EXHAUSTION →

PLASMA PROCESSING SYSTEM AND METHOD FOR MANUFACTURING A SEMICONDUCTOR DEVICE BY USING THE SAME

BACKGROUND OF THE INVENTION

This invention relates to a plasma processing system for processing the surface of a semiconductor substrate (semiconductor wafer) or the like through physical action or chemical reaction of particles activated by conversion of a starting gas into a plasma.

A parallel plate ECR (electron cyclotron resonance) plasma system using UHF (ultrahigh frequency) is described in Japanese Patent Laid-Open No. 321031/1997 (corresponding U.S. Pat. No. 5,891,252). According to the invention set out in the publication, the problems to solve are to achieve processing of a high speed, a high selection ratio and a high aspect ratio, and a stable etching characteristic over a long time. For solving the problems, an electron cyclotron resonance phenomenon with an electromagnetic wave from a UHF power supply is used to form a plasma wherein the electromagnetic wave is radiated from a circular conductor plate located at a position in face-to-face relation with a substrate to be processed.

It will be noted that an etching system using a permanent magnet is disclosed, for example, "1988 Dry Process Symposium", 1988, pp. 54–57. The etching system disclosed in this literature is called magnetron RIE system wherein a permanent magnet is located over a processing chamber so as to permit RF power (13.54 MHz) only to a wafer, thereby generating a plasma on a main surface of the wafer.

We have made studies on a plasma etching system particularly shown in FIG. 13, based on the plasma processing system disclosed in the publication.

FIG. 13 is a view showing an arrangement of a parallel plate ECR plasma processing system for etching a substrate (semiconductor wafer) to be processed. In FIG. 13, a processing chamber 1 has therein a planar plate 2 provided with a shower plate 10, a dielectric substance, and a processing mount 9. A process gas is introduced into the processing chamber 1 from a gas feed port 5 provided at the planar plate 2 via the shower plate 10. A ultra-high-frequency (UHF) electromagnetic wave of 300 MHz to 1 GHz generated in a high frequency power supply 11 is introduced into the etching chamber from the planar plate 2 through a tuner 13 wherein a gas is converted to a plasma. In order to permit the UHF electromagnetic wave to be efficiently transmitted into the processing chamber, the outer diameter of the planar plate 2 and the type of dielectric substance 3 are, respectively, determined so that the high frequency is resonated at a desired mode ($TM_{01}$ mode herein) between the planar plate 2 and an earth 4.

The UHF electromagnetic wave is resonated between the planar plate 2 and the earth 4 and transmitted from the periphery of the dielectric substance 3 toward the processing chamber 1. For high efficiency discharge, a solenoid coil 17 for generating a magnetic field is disposed around the processing chamber 1, and a coil current is so controlled that a magnetic field ranging from 0 gauss to 360 gausses is generated beneath the shower plate 10. Eventually, there is generated a high density plasma having an electron density of $10^{11}$ electrons/cm$^3$ or over by use of electron cyclotron resonance (ECR). A substrate 8 to be processed is set on the processing mount 9 and etched by means of the plasma. The etching gas is introduced into the etching chamber 1 through a gas feed port 5 and exhausted to outside of the etching chamber by means of an exhaust pump.

A high frequency bias of from 100 kHz to 15 MHz is applied from a high frequency power supply 15 via a tuner 16 to the processing mount 8 on which the substrate 8 to be processed is mounted. The distance between the substrate 8 to be processed and the shower plate 10 can be changed from 20 mm to 150 mm by use of a vertically moving mechanism for the mount 9. The processing mount 9 has such a structure that enables one to provide a focus ring 7 with a width of about 30 mm around the substrate 8 to be processed. The focus ring 7 is so arranged that a high frequency is applied thereto as branched from 10 to about 50% of the high frequency power applied from the high frequency power supply 15 to the substrate 8 to be processed. Usually, the focus ring 7 is made of aluminium (Al) at the lower portion thereof and crystalline silicon (Si) at the upper portion thereof, and may be made of impurity-doped Si, silicon carbide (SiC) or Al at the upper portion thereof.

The planar plate 2 may be applied with a frequency (ranging from 10 kHz to 27 MHz), different from that from the high frequency power supply 11, from a high frequency power supply 12 via a tuner 14. This shower plate 10 is in contact with the planar plate 2, and a coolant is introduced into the planar plate 2 from a coolant inlet 6 to control the temperature of the shower plate 10.

In the system shown in FIG. 13, uniformity is optimized by changing an electric current mainly passing through the solenoid coil 17 to control the position of magnetic field intensity serving as an ECR condition.

In this arrangement, the plasma can be generated in a high efficiency, and the thus generated plasma is transported to the surface of a substrate to be processed with the aid of a magnetic field in an efficient manner, thus enabling one to make highly efficient processing. Moreover, the arrival of the plasma at the processing container walls is suppressed by the action of the magnetic field, thus making it possible to suppress the variation in processing conditions as will be accompanied by the change in the state of the processing container walls.

Our studies revealed that further problems to solve were involved in the above-stated plasma processing system.

The plasma processing system shown in FIG. 13 has no problem on uniformity when the ion current flux ranges from low to medium levels and exhibits a linear characteristic relative to making power. However, when the making power is increased to obtain a high plasma density (of $10^{11}$/cm$^3$ or over), the wafer uniformity of the etching rate becomes 10% or over, and thus, a further improvement has been necessary. More particularly, the distribution of the etching rate is such that, as shown in FIG. 5, the rate becomes smaller only in the vicinity of the wafer center. This is ascribed to the uniformity of the plasma density, which has been a problem to solve.

In FIG. 3, there are shown a magnetic field vector (a) and an electric field vector of an electromagnetic wave by the influence of the solenoid coil 17 beneath the planar plate in the etching system shown in FIG. 13. It has been uncovered that when using the etching system shown in FIG. 13, the angle of intersection between the direction of electric line of force (electric field vector (b)) and the magnetic line of flux (magnetic field vector (a)) is smaller at the center of the planar plate, thus the efficiency of plasma generation being low. More particularly, there is a portion, in which the magnetic field vector (a) is coincident with the electric field vector (b), at the center of the planar plate. Thus, this is considered to cause the non-uniformity under such high plasma density conditions as mentioned above.

SUMMARY OF THE INVENTION

An object of the invention is to provide a parallel plate ECR plasma processing system, which ensures uniform processing of a substrate to be processed in a low density to high density plasma condition.

Another object of the invention is to provide a method for making a semiconductor device, which includes the etching step capable of reducing an in-plane variation of a semiconductor wafer.

The parallel plane ECR plasma system of the invention includes a solenoid coil as a first magnetic-field-forming means and a second magnetic field-forming means located in the vicinity of a planar plate so as to from a local magnetic field. The magnetic field formed by the first magnetic field-forming means is influenced by the magnetic field from the second magnetic field-forming means so that an angle of intersection of an electric line of force and a magnetic line of flux caused by an electromagnetic wave is locally changed. Eventually, the interactions of the electromagnetic wave and the magnetic field become substantially equal over the entire surface beneath the planar plate, enabling one to generate a uniform plasma.

When the polarity of the magnetic field formed by the first magnetic filed-forming means and the polarity of the magnetic field formed by the second magnetic field-forming means are opposite to each other, the effect of increasing the angle increases. In this way, the degree of the interaction of the magnetic field and the electromagnetic force beneath the center of the planar plate increases, thereby ensuring a uniformity of 10% or below at a high plasma density (of $1 \times 10^{12}/cm^3$ or over). In addition, when the frequency of the electromagnetic wave used for plasma generation ranges from 80 MHz to 500 MHz, the intensity distribution of an electric field vector of the electromagnetic wave can be made uniform with respect to a substrate of a large diameter (diameter: 300 mm) to be processed, thus making it possible to generate a uniform plasma with the aid of the above-mentioned magnetic field control.

The parallel plate ECR plasma system according to one embodiment of the invention is characterized by comprising a processing mount for mounting a substrate to be processed in a processing container, a planar plate capable of radiating an electromagnetic wave at a position in face-to-face relation with the substrate to be processed, a first magnetic field-forming means for forming a magnetic field, which is disposed at an outside or inside of the processing container so as to convert a given type of gas to a plasma by aid of the electromagnetic wave, and a second magnetic field-forming means located in the vicinity of the planar plate for forming a magnetic field different from the magnetic field formed by the first magnetic field-forming means, wherein a direction of a magnetic line of flux in the vicinity of the planar plate is controlled by combination of the magnetic field formed by the first magnetic field-forming means and the magnetic field formed by the second magnetic filed-forming means.

According to another embodiment of the invention, there is provided a parallel plate ECR plasma system, which is characterized by comprising a processing mount for mounting a substrate to be processed in a processing container, a planar plate capable of radiating an electromagnetic wave at a position in face-to-face relation with the substrate to be processed, a magnetic field-forming means for forming a magnetic field, which is disposed at an outside or inside of the processing container so as to convert a given type of gas to a plasma by aid of the electromagnetic wave, and means for controlling a direction, on the planar plate, of the magnetic field formed by the magnetic field-forming means, which depends on the magnitude and direction of an electric field vector of the electromagnetic wave formed on the surface of the planar plate, wherein the given type of gas is converted to a plasma for processing the substrate to be processed.

According to a further embodiment of the invention, there is provided a parallel plate ECR plasma system, which is characterized by comprising a processing mount for mounting a substrate to be processed in a processing container, a planar plate capable of radiating an electromagnetic wave at a position in face-to-face relation with the substrate to be processed, a magnetic field-forming means for forming a magnetic field, which is disposed at an outside or inside-of the processing container so as to convert a given type of gas to a plasma by aid of the electromagnetic wave, and means for controlling a distribution of a magnetic field on the surface of the planar plate, depending on a distribution of an electric field of the electromagnetic wave on the surface of the planar plate, in such a way that an efficiency of generation of the plasma formed through the interaction of the electric field of the electromagnetic wave formed on the surface of the planar plate and the magnetic field formed by the magnetic field-forming means has a difference within ±20% in a region of not smaller than 50% of the entire surface of the planar plate, wherein the given type of gas is converted to a plasma, with which the substrate to be processed is processed.

According to a still further embodiment of the invention, there is provided a parallel plate ECR plasma system, which is characterized by comprising a processing mount for mounting a substrate to be processed in a processing container, a planar plate capable of radiating an electromagnetic wave at a position in face-to-face relation with the substrate to be processed, a magnetic field-forming means for forming a magnetic field for generating a plasma by aid of the electromagnetic wave, and means for controlling a distribution of a magnetic field on the planar plate so that a product of a sine of the angle, on the planar plate, between the electric field vector of the electromagnetic wave and the magnitude of the electric field vector of the electromagnetic wave formed on the surface of the planar plate has a difference within ±20% in a region of not smaller than 50% of the entire surface of the planar plate, wherein a given type of gas is converted to a plasma, with which the substrate to be processed is processed.

According to another embodiment of the invention, there is provided a method for manufacturing a semiconductor device by use of a plasma processing system which comprises a processing mount for mounting a substrate to be processed in a processing container, a planar plate capable of radiating an electromagnetic wave at a position in face-to-face relation with the substrate to be processed, a first magnetic field-forming means for forming a magnetic field, which is disposed at an outside or inside of the processing container so as to convert a given type of gas to a plasma by aid of the electromagnetic wave, and a second magnetic field-forming means located in the vicinity of the planar plate for forming a magnetic field different from the magnetic field formed by the first magnetic field-forming means, wherein a direction of a magnetic line of flux in the vicinity of the planar plate is controlled by combination of the magnetic field formed by the first magnetic field-forming means and the magnetic field formed by the second magnetic field-forming means, the method comprising the step of etching an insulating film formed on a main surface of the semiconductor wafer.

According to still another embodiment of the invention, there is provided a method for manufacturing a semiconductor device, which comprising the steps of (a) forming an insulating film on a main surface of a semiconductor substrate, (b) forming a mask having a given pattern on the insulating film, (c) placing the semiconductor substrate, on which the mask has been formed, on a processing mount in a processing container, radiating an electromagnetic waver from a planar plate in face-to-face relation with the semiconductor substrate surface on which the mask has been formed, forming a magnetic field so that a plasma is generated between the semiconductor substrate surface and the planar plate by aid of the electromagnetic wave, controlling a direction of the magnetic field on the planar plate, etching the insulating film at portions where the mask is not formed, and forming an opening in the insulating film; and (d) burying a conductor layer in the opening.

DETAILED DESCRIPTION OF THE PREFERRED EMBODIMENTS (Embodiment 1)

Figure 1:
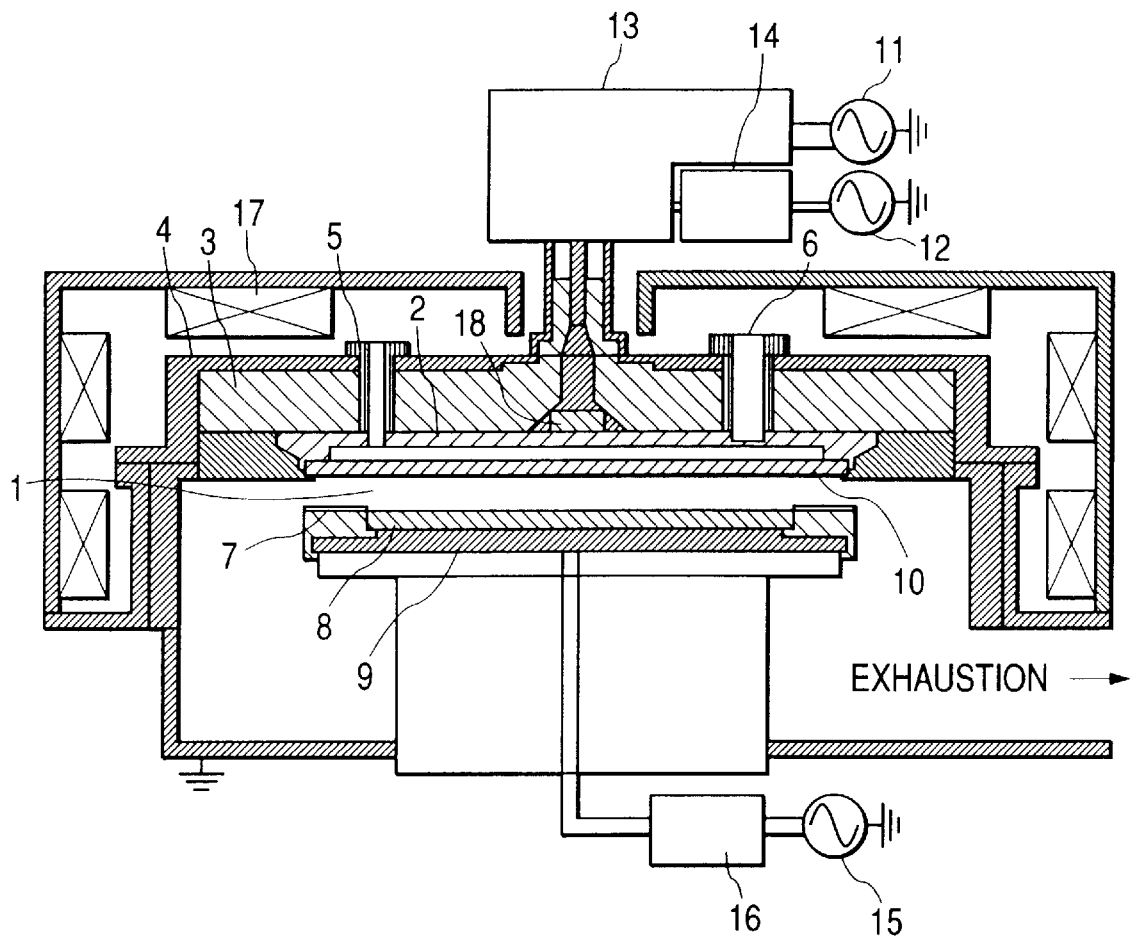
FIG. 1 is a schematic view showing a plasma processing system according to Embodiment 1 of the invention.

FIG. 1 shows a plasma processing system according to Embodiment 1 of the invention. A processing chamber 1 has therein a planar plate 2 provided with a shower plate 10, a dielectric substance 3 and a processing mount 9. In this embodiment, the diameter of the planar plate 2 is same as the diameter of a substrate to be processed mounted on the processing mount 9. A process gas is introduced from a gas introduction port 5 provided at the planar plate 2 into the processing chamber 1 via the shower plate 10 formed of silicon (Si). This shower plate 10 is provided to make a uniform gas stream against the entire surface of a wafer and has a plurality of gas introduction holes (not shown). The electromagnetic wave generated in a high frequency power supply 11 is passed from a tuner 13 through the planar plate 2 into the processing chamber 1 wherein the gas is converted to a plasma. The outer diameter of the planar plate 2 and the type of material for the dielectric substance or body 3 are, respectively, determined so as to permit resonance in $TM_{01}$ mode. Accordingly to this embodiment, an electromagnetic wave of 100 MHz is supplied to the planar plate from the high frequency power supply 11.

For high efficiency discharge, a solenoid coil 17 used as a first magnetic field-forming means is disposed around the etching chamber 1. The coil current of the solenoid coil 17 is so controlled that a magnetic field of from 0 gauss to 360 gausses is applied to beneath the shower plate 10. An electron cyclotron resonance (ECR) magnetic field is established between the substrate 8 to be processed and the shower plate 10, by which a high density plasma of $10^{11}/cm^3$ or over is created therebetween.

The main direction of the magnetic field formed by the solenoid coil 17 is along the direction of from the planar plate 2 toward the substrate 8 to be processed. The substrate 8 to be processed is set on the processing mount 9 and etched by means of the plasma. In the course of the etching process, an etching gas is fed into the processing chamber through the gas introduction port 5 and exhausted to outside of the processing chamber 1 by means of an exhaustion pump. The flow rate of the gas is, for example, at 500 cc/minute, and the pressure in the processing chamber 1 is maintained at about 2.0 Pa.

For the purpose of promoting the reaction on or in the surface of the substrate by changing an ion lead-in energy, the processing mount 9, on which the substrate has been set, is applied, via a tuner 16, with a high frequency electric field ranging from 100 kHz to 15 MHz by means of a high frequency power supply 15. The distance between the processing mount 9 and the shower plate 10 can be changed within a range of from 20 mm to 90 mm by use of a mechanism of vertically moving the processing mount 9. The processing mount 9 has such a structure as to permit a focus ring 7 having a width of about 30 mm to be disposed around the substrate 8 to be processed.

The focus ring 7 is so arranged that a high frequency corresponding to about 10 to 50% of and branched from the high frequency applied to the substrate 8 is applied thereto. Usually, the focus ring 7 is made of Al at the lower portion thereof and crystalline Si at the upper side thereof. The upper side may be made of impurity-doped Si, SiC or Al.

The material for the shower plate 10 consists of Si. This shower plate 10 is in contact with the planar plate 2, and the temperature of the shower plate is controlled by introducing a coolant from a coolant inlet 6 into the planar plate 2.

The planar plate 2 is applied with a frequency (radio wave band: 50 kHz to 15 MHz), different from that of the high frequency power supply 11, from a high frequency power supply 12 via a tuner 14. The purpose for this is to control the reactivity on or in the surface of the shower plate 10. The reaction between the shower plate 10 made of silicon (Si) and excess ions (e.g. fluorine ions) in the plasma can be appropriately controlled by means of the high frequency power supply 12. This makes it easy to control an etching selection ratio at the side of the substrate 8 to be processed.

A magnet 18 (e.g. a permanent magnet) serving as a second magnetic field-forming means is disposed at the back side of the center of the planar plate 2.

The electromagnetic wave radiation unit in Embodiment 1 is described in detail with reference to FIG. 2.

Figure 2:
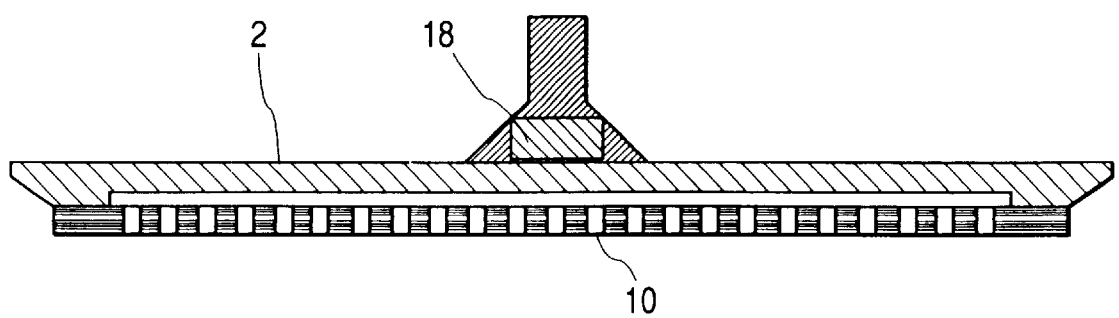
FIG. 2 is a schematic view showing a specific arrangement of a second magnetic field-forming means according to Embodiment 1 of the invention.

In FIG. 2, the shower plate 2 is provided in contact with the planar plate 2. The core wire of a co-axial line for transmitting a high frequency is coupled to the upper side of the planar plate 2. The coupling portion is in the form of a cone wherein a magnet 18 is placed. The magnet 18 is so set as to generate a magnetic field of a polarity opposite to that of the magnetic field formed by means of the solenoid coil 17. In this embodiment, the magnet 18 has N pole at the upper side thereof and S pole at the lower side. The magnet 18 is in the form of a cylinder having a diameter of 20 mm and a thickness of 10 mm, with its magnetic flux density on the surface thereof being at 4500 gausses. The magnetic filed formed by means of this magnet 18 influences only a very small space, and thus, a magnetic flux density on the substrate 8 is at about 20 gausses or below.

Figure 13:
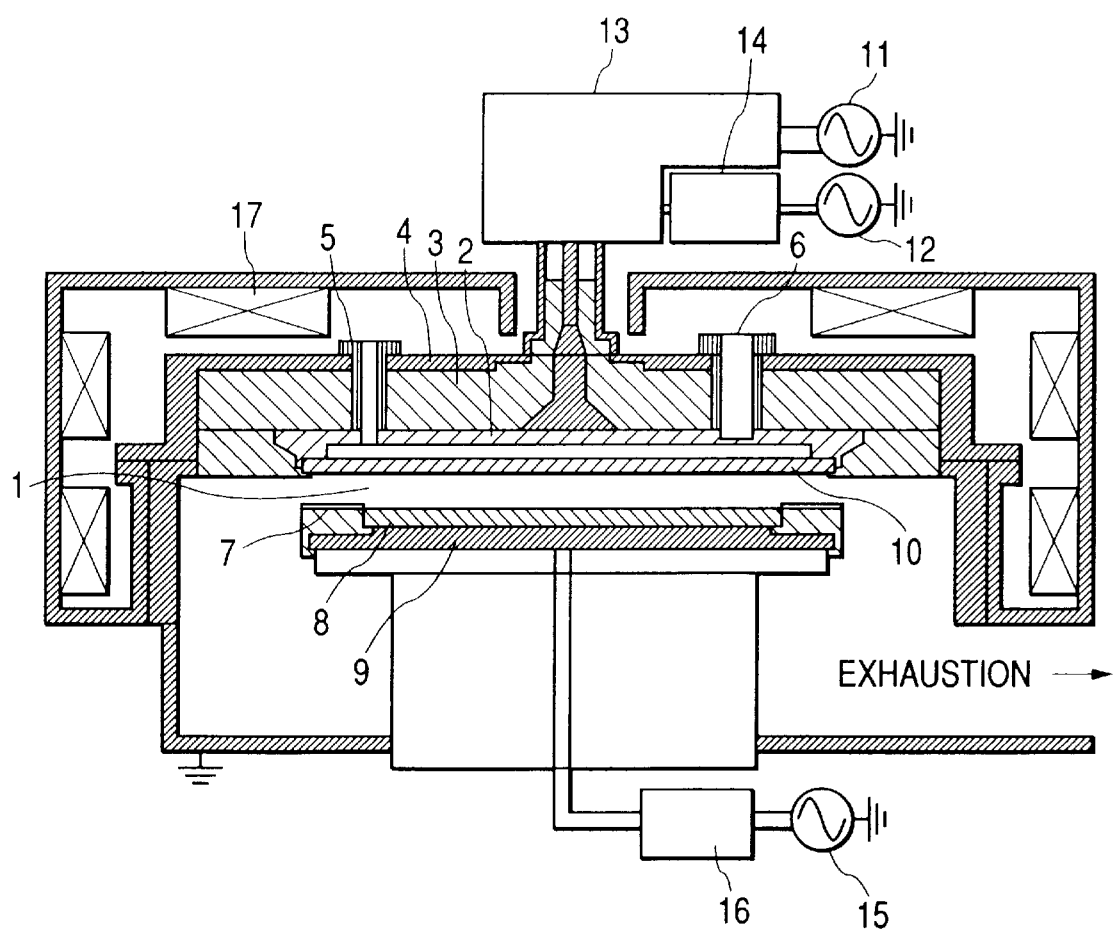
FIG. 13 is a sectional view showing a prior-art plasma processing system on which we made studies.

Next, the comparison in function between the planar plate shown in FIG. 13 and the planar plate in Embodiment 1 is described.

Figure 3:
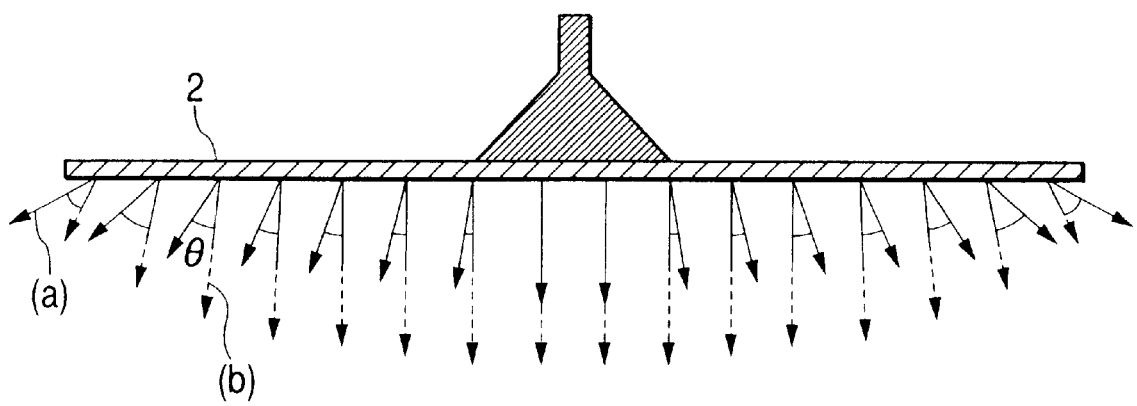
FIG. 3 is a schematic view showing a magnetic field distribution beneath a planar plate in a plasma processing system shown in FIG. 13.

FIG. 3 is an illustrative views showing the relation between the magnetic field vector and the electric field vector in the vicinity of the planar plate 2 shown in FIG. 13. A magnetic field vector (a), which is caused by the solenoid coil 17, beneath a shower plate (not shown) placed in the vicinity of the planar plate 2 shown in FIG. 13, and an electric field vector (b) of an electromagnetic wave fed from the high frequency power supply 11 are as shown in FIG. 3, respectively. The product of a sine of an angle θ established between the electric filed vector (b) of the electromagnetic wave and the magnetic field vector (a) caused by the solenoid coil 17 and the magnitude of the electric field vector corresponds to an efficiency of plasma generation in the respective in-plane portions of the planar plate 2. More particularly, the electrons in the electric field are supplied with a satisfactory energy by the action of the magnetic field vector. With the planar plate shown in FIG. 3, the angle θ of the intersection between the electric field vector (b) and the magnetic field vector (a) is smaller at the center of the planar plate. This is because the center of the planar plate 17 is kept away from the solenoid coil 17, and the magnetic field vector (a) caused by the solenoid coil 17 is in a direction vertical to the plane of the planar plate 2 at which the vector (a) is substantially coincident with the electric field vector (b). Accordingly, the interaction between the electric field component and the magnetic field component is unlikely to occur, resulting in the lowering of an efficiency of plasma generation. On the other hand, the peripheral portion of the planar plate 2 is in close vicinity to the solenoid coil 17, so that the angle θ between the magnetic field vector (a) and the electric field vector (b) become large. More particularly, the efficiency of plasma generation at the peripheral portion of the planar plate 2 becomes greater than at the central portion because of the interaction between the electric field component and the magnetic field component. This is considered for the reason why non-uniform plasma generation takes place beneath the planar plate 2.

Figure 4:
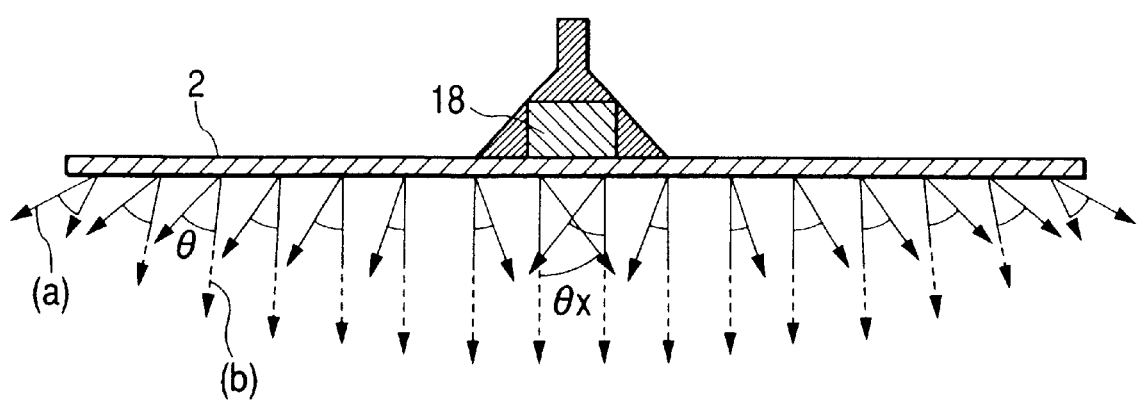
FIG. 4 is a schematic view showing a magnetic field distribution beneath a planar plate in Embodiment 1 of the invention.

FIG. 4 is an illustrative view showing the relation between the magnetic field vector and the electric field vector in the vicinity of the planar plate 2 in Embodiment 1 of the invention. Upon comparison with the planar plate structure shown in FIG. 3, an angle θ x of the intersection between the electric field vector (b) and the magnetic field vector (a) at the center of the planar plate 2 can be made greater by use of a magnet 18. As a consequence, the efficiency of plasma generation at the central portion can be improved. When the intensity of the magnetic field formed at the surface of the shower plate 10 by means of the magnet 18 is set at a level between 50 gausses to 600 gausses, a necessary effect can be obtained. When the magnetic field exceeds 600 gausses, an influence on the plasma becomes too great, thereby inducing non-uniformity of the plasma. Accordingly, the intensity of the magnetic field formed with the magnet 18 serving as a second magnetic field-forming means is effectively in the range of from 50 gausses to 600 gausses at the surface of the shower plate 10.

With respect to the electromagnetic wave for plasma generation fed to the planar plate 2, 100 MHz is used in this embodiment, and an electromagnetic wave in the range of 80 MHz to 500 MHz may be used, thereby forming a uniform distribution of the electric field intensity on the surface of the planar plate. More particularly, the use of an intensity lower than that in the plasma processing system permits a difference in the electric field intensity between the central portion and the peripheral portion of the planar plate 2 being uniformized. The uniformization in interaction between the electric field and the magnetic field caused by the magnet 18 enables uniform plasma generation over the entirety of the wafer. Especially, when using a substrate (semiconductor wafer) having a diameter of 8 inches or over, there can be obtained both a very uniform electric field distribution in the range of 80 MHz to 200 MHz and satisfactory plasma generation through interaction with a high magnetic field. The frequency of the electromagnetic wave is shown in FIG. 13.

Next, the distribution of an etching rate in the wafer in Embodiment 1 is now described.

Figure 5:
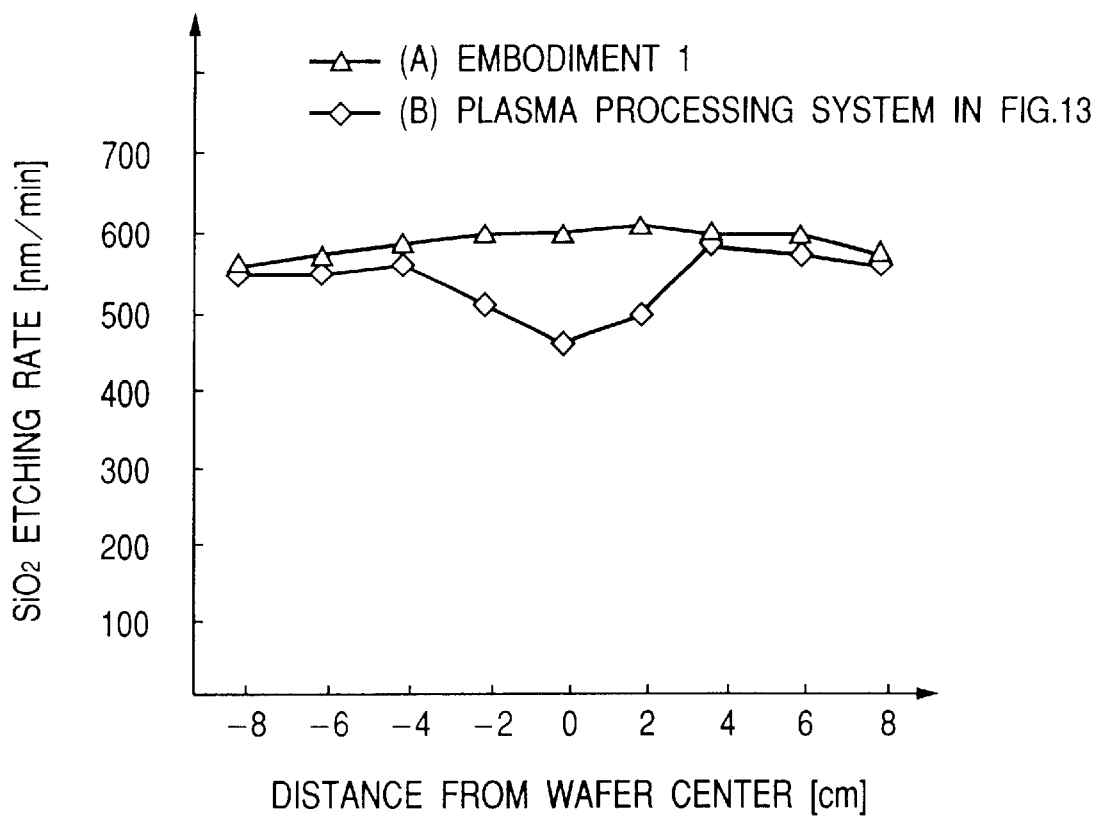
FIG. 5 is a characteristic graph showing the relation between the distance from a wafer center and the etching rate of a silicon oxide film.

FIG. 5 is a characteristic graph showing the distribution of the etching rate of a silicon oxide film ($SiO_2$) in the wafer in Embodiment 1 and in the case using the plasma processing system shown in FIG. 13, respectively. The substrate to be processed is one wherein a silicon oxide film ($SiO_2$) is formed on the silicon wafer surface. In the figure, the abscissa indicates a distance from a wafer center and the ordinate indicates an etching rate of the $SiO_2$ film.

As shown in FIG. 5, with the plasma processing system (B) shown in FIG. 13, the etching rate is slower at center of the wafer than at the peripheral portion. This is for the reason set out with reference to FIG. 3 hereinbefore.

On the other hand, according to Embodiment 1, as (A), using the magnet 18, the etching rate is improved at the central portion for the reason set forth with reference to FIG. 4 before, thus enabling one to uniformly etch the wafer. Thus, a uniform plasma distribution can be maintained over the wafer surface under high plasma density conditions. As a result, there can be realized a plasma processing system that provides a wide range of plasma conditions including an etching process using a low plasma density and an etching process wherein high speed etching is intended by use of a high plasma density.

In view of the etching rate distribution shown in FIG. 5, if the efficiency of the interaction between the electric field and the magnetic field caused by the magnet 18 is made uniform over the planar plate, a very uniform, large-sized plasma can be formed. It will be noted that when the magnetic field is actually controlled within a region of not smaller than 50% of the surface of the planar plate in such a way that the plasma generation efficiency is within ±20%, a uniform plasma that is necessary for the surface of the substrate to be processed can be generated by the effect of diffusion or the like.

Further, the plasma generation efficiency can be enhanced when the intensity of the combined magnetic field from the first magnetic field-forming means and the second magnetic field-forming means corresponds to the electron cyclotron resonance conditions (which are at about 40 gausses in this embodiment where an electromagnetic wave of 100 MHz is used) within a range of ±50 mm relative to the surface of the shower plate 10 attached to the planar plate 2. In addition, the plasma generation distribution can be appropriately controlled by controlling the position of the electron cyclotron resonance condition by a current value passing through the solenoid 17 or the set position of the magnet 18.

In Embodiment 1, silicon is used as a material for the shower plate 10 provided on the surface of the planar plate 2, and similar effects are obtained when using other materials such as quartz, aluminium oxide, aluminium, silicon carbide, carbon, silicon nitride, stainless steels of the like.

In Embodiment 1, the diameter of the planar plate 2 is made same as the diameter of the substrate 2 to be processed, and similar effects can be expected when the former diameter has 0.2 to 2 times that of the substrate. That is, as described with reference to FIG. 3, the lowering of the plasma generation efficiency occurs at the center of the planar plate 2. Accordingly, when the plasma generation efficiency is increased at the central portion, the diameter of a processable substrate (semiconductor wafer) can be increased.

In Embodiment 1, aside from the electromagnetic wave of 100 MHz for forming a plasma over the planar plate 2, a high frequency electric field ranging from 50 kHz to 15 MHz has been applied from another high frequency power supply 12. In this connection, however, part of an output from the high frequency power supply 15, which is applied to the substrate, may be branched. In this case, when the branched high frequency electric field is applied to while shifting the phase of the high frequency electric field applied after the branching by 160 degrees to 200 degrees on comparison with the high frequency electric field applied to the substrate 8, the biasing effect on the planar plate 2 and the substrate 8 can be enhanced.

In Embodiment 1 of the invention, the etching gas used consists of a mixed gas of argon (500 cc/minute to 1000 cc/minute), $C_5F_8$ (10 cc/minute to 30 cc/minute) and oxygen. The etching of the silicon oxide film (or a thin film made mainly of a silicon oxide film) is likewise possible using a fluorocarbon gas other than $C_5F_8$. Alternatively, the etching of the silicon oxide film (or a thin film made mainly of a silicon oxide film) may be possible using a mixed gas of argon, a fluorocarbon gas, carbon monoxide and oxygen. According to Embodiment 1 of the invention, the main gas used as the etching gas should contain argon and a fluorocarbon gas.

Moreover, when using the plasma processing system of Embodiment 1 wherein hydrogen and nitrogen or ammonia are used as main reactant gases, etching of an insulating film having a low dielectric constant and made of an organic film is possible.

In addition, when using the plasma processing system of Embodiment 1 using any one of chlorine, chlorine and boron chloride, chlorine, born chloride and oxygen, and chlorine and a hydrocarbon gas, etching of a material mainly composed of silicon, aluminium, tungsten and/or ruthenium is possible.

(Embodiment 2)

Figure 6:
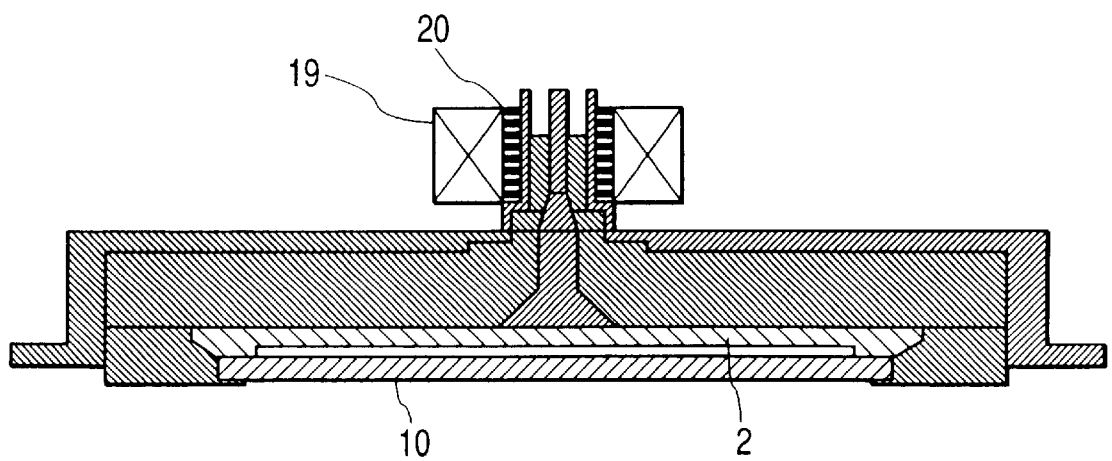
FIG. 6 is a schematic view showing a specific arrangement of a second magnetic field-forming means in Embodiment 2 of the invention.

FIG. 6 is an illustrative view showing an electromagnetic wave radiation unit in Embodiment 2.

In Embodiment 2, a coil 19 and a yoke 20 are used in place of the magnet 18 of Embodiment 1, so that a magnetic field vector is given in the vicinity of the center of the planar plate 2 in a direction along the surface of the planar plate. More particularly, the coil 19 and the yoke 20 are disposed on the central portion of the planar plate 2, by which an angle θ x of the intersection between the electric field vector (a) and the magnetic field vector (b) can be increased in the vicinity of the center of the planar plate 2 a shown in FIG. 4.

Accordingly, in Embodiment 2, a similar effect as in Embodiment 1 can be obtained, and thus, uniform processing of a substrate to be processed is possible on the in-plane surface thereof.

According to Embodiment 2 of the invention, the coil 19 is disposed to the outside of the processing chamber 1, permitting a simpler arrangement of the planar plate 2 in comparison with Embodiment 1.

In Embodiment 2, the distance between the coil 19 and the planar plate 2 becomes more distant than in Embodiment 2 wherein the magnet 18 is placed just on the planar plate. Accordingly, the arrangement of Embodiment 2 is so designed that the yoke 20 is used to reinforce the magnetic field of the coil 19, and an electric current passing through the coil 19 is lessened. An improvement of the yoke 19 enables one to further increase the magnetic field of the coil 19.

(Embodiment 3)

Figure 7A:
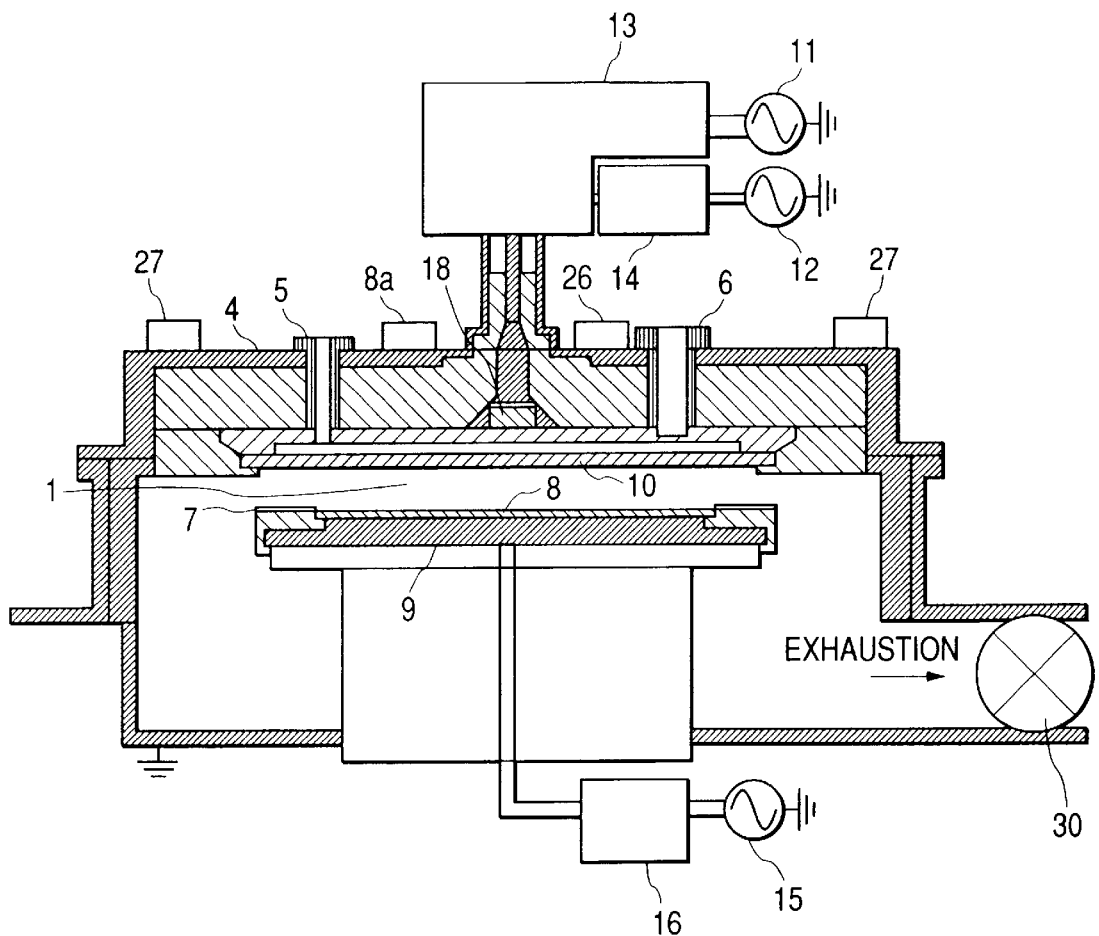
FIGS. 7(a) and 7(b) are, respectively, a sectional view showing a plasma processing system as a whole and a schematic view for illustrating an arrangement of permanent magnets, both according to Embodiment 3 of the invention.
Figure 7B:
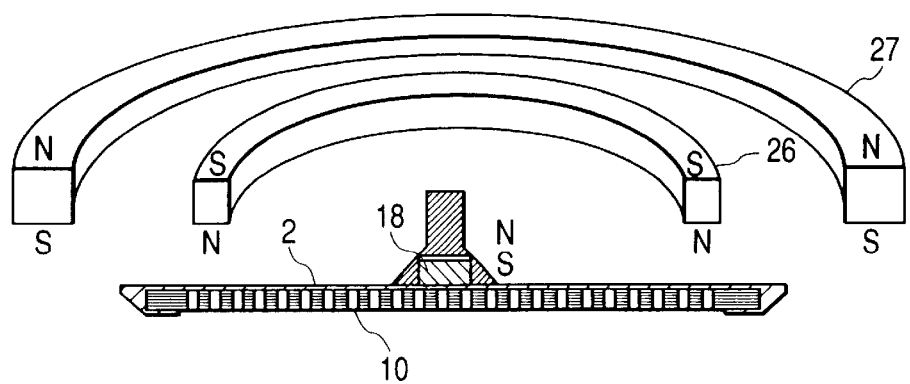

FIGS. 7(a) and 7(b) show Embodiment 3 of the invention wherein FIG. 7(a) is a sectional view of a plasma processing system as a whole and FIG. 7(b) is an illustrative view showing an arrangement of permanent magnets in Embodiment 3. In Embodiment 3, concentrically arranged, circular permanent magnets 26, 27 are used, as the first magnetic filed-forming means, in place of the solenoid in Embodiment 1.

In FIGS. 7(a) and 7(b), the circular permanent magnets 26, 27 are magnetized in vertical directions, and are arranged in such a way that the poles including the poles of the permanent magnet 18, which is set at the center thereof and used as a second magnetic field-forming means, are in an alternate order. More particularly, where the permanent magnet 27 that is positioned at the center and used as the second magnetic field-forming means, has an S pole at the lower portion thereof (a lower surface), the circular permanent magnet 26 provided at the outside of the permanent magnet 28 is so set that the N pole is set at the lower portion (lower side surface) and the S pole is set at the upper portion (upper side surface). The circular permanent magnet 27 that is provided at the outer side of the circular permanent magnet 26 is so set that the S pole is at the lower side and the N pole is at the upper side. In this arrangement, a concentric, axisymmetric magnetic field component having a component in a direction parallel to the surface of the planar plate can be created at the lower surface of the planar plate, thus making it possible to form a uniform, highly efficient plasma. Moreover, since no solenoid is used, the system may be made smaller in size. It will be noted that in FIG. 7(a), the gas is exhausted through an exhaustion conductance 30 for controlling an exhaustion speed.

According to Embodiment 3 of the invention, permanent magnets alone are used for the formation of a magnetic field, so that the magnetic field is formed only locally. Thus, there is formed a necessary magnetic field beneath the planar plate required for the formation thereof, and at the same time, there can be realized a magnetic field-free condition at the wafer surface that is a substrate to be processed. If a magnetic field exists in the vicinity of the substrate, there is the apprehension of causing a device damage ascribed to the difference in movement between the electrons and the ions. In Embodiment 3, a low tendency to damage is obtained simultaneously with an efficient plasma generation.

It should be noted that a similar effect is obtained when the circular permanent magnets 26, 27 are arranged alternately so that the poles are reversed to the above case. The circular permanent magnets 26, 27 are arranged doubly, and a plurality of circular permanent magnets may be concentrically used.

(Embodiment 4)

Figure 8A:
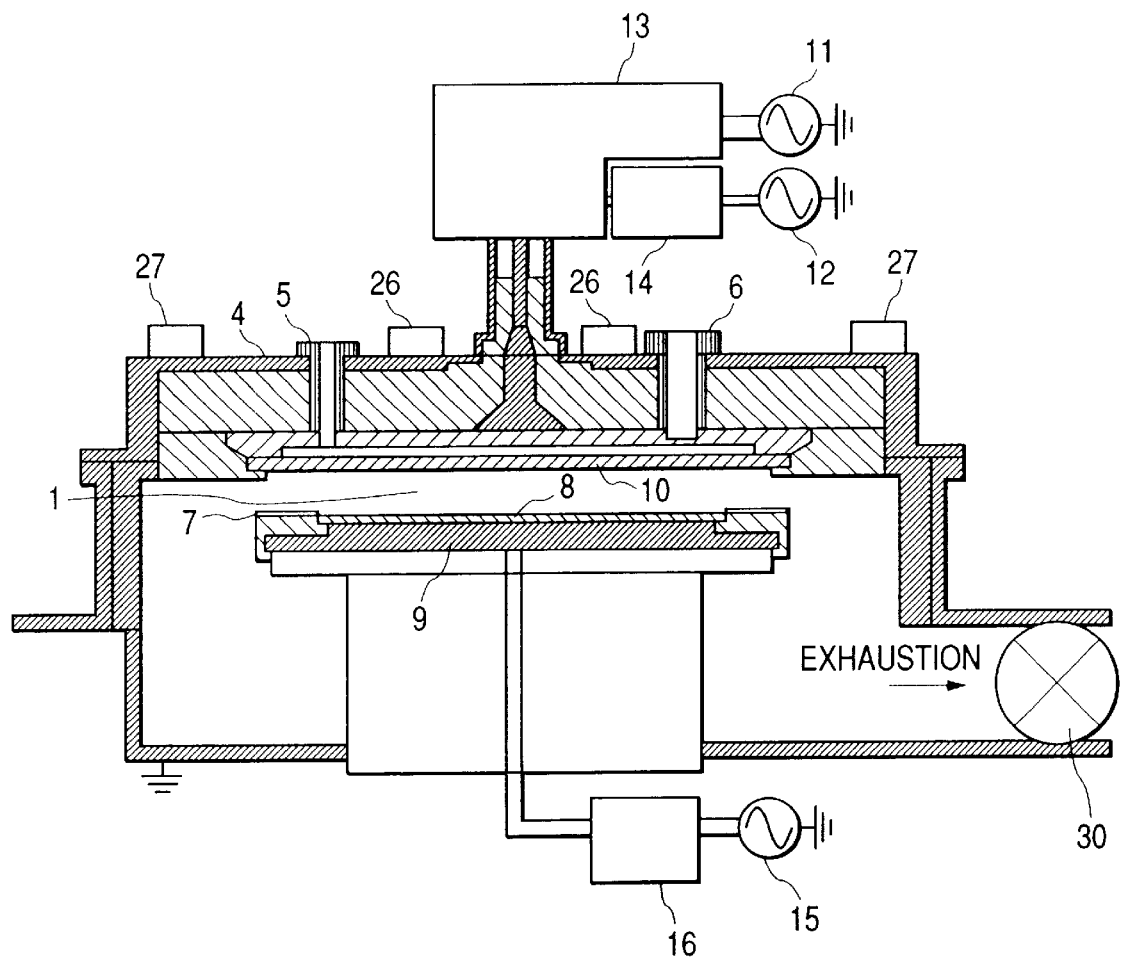
FIGS. 8(a) and 8(b) are, respectively, a sectional view showing a plasma processing system as a whole and a schematic view for illustrating an arrangement of permanent magnets, both according to Embodiment 4 of the invention.
Figure 8B:
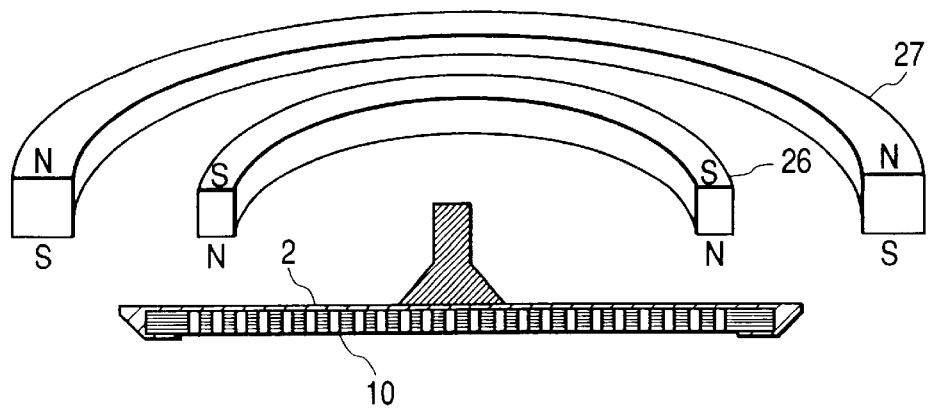

In FIGS. 8(a) and 8(b), there is shown a plasma processing system according to Embodiment 4 of the invention. The arrangement of this embodiment is such that the permanent magnet serving as a second magnetic field-forming means, which is provided at the center in Embodiment 3, is not used in this embodiment. FIG. 8(b) is an illustrative view showing the detail of a permanent magnet arrangement. As shown in FIG. 8(b), an inner circular permanent magnet 26 is placed so that the N pole is at the lower side and the S pole is at the upper side. On the other hand, an outer circular permanent magnet 27 is so set that the S pole is at the lower side and the N pole is at the upper side. This arrangement allows a concentric axisymmetrical magnetic field component having a component in a direction parallel to the surface of the planar plate to be created at the lower surface of the planar plate. Thus, uniform and highly efficient plasma generation is ensured.

It will be noted that in Embodiment 4, the circular permanent magnets 26, 27 may be set alternately in a reverse pole arrangement. The circular permanent magnets 26, 27 are placed doubly, and a plurality of circular permanent magnets may be concentrically arranged.

(Embodiment 5)

Figure 9A:
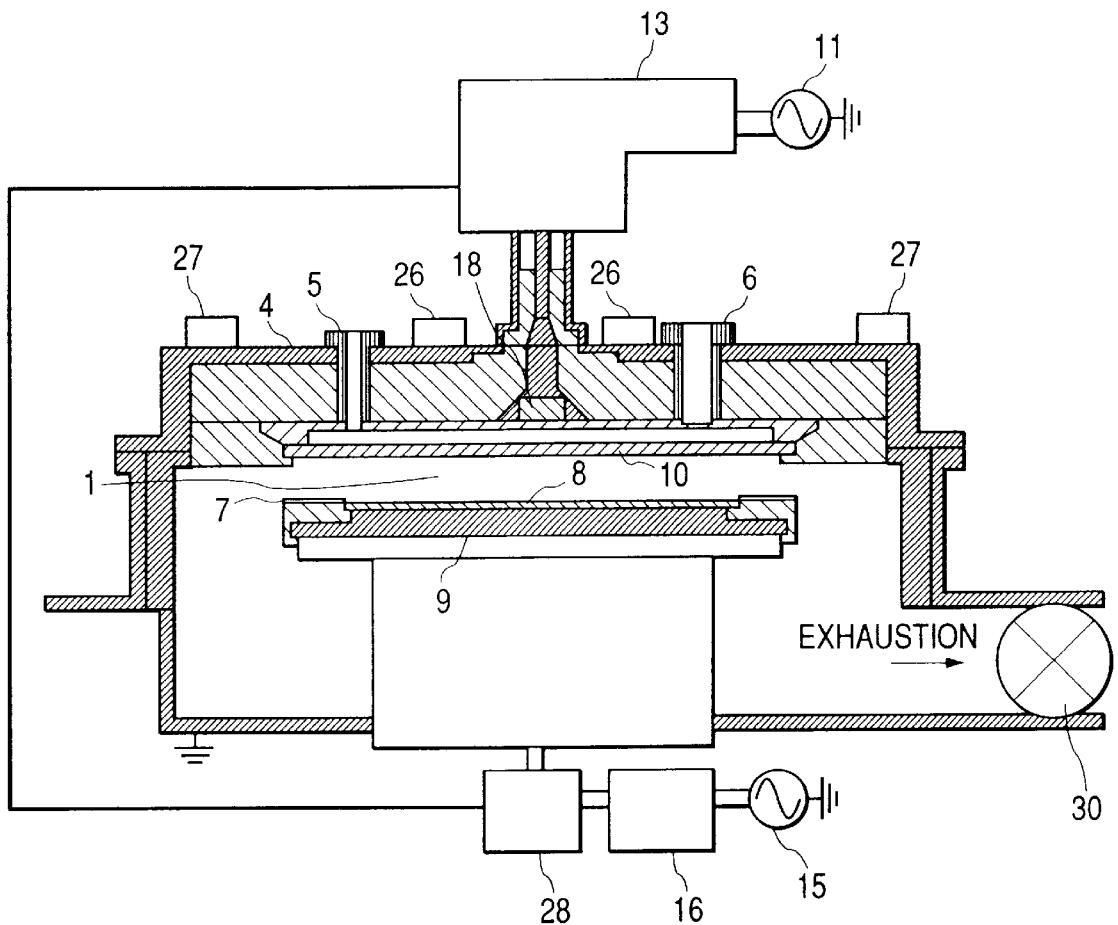
FIGS. 9(a) and 9(b) are, respectively, a sectional view showing a plasma processing system as a whole and a schematic view for illustrating an arrangement of permanent magnets, both according to Embodiment 5 of the invention.
Figure 9B:
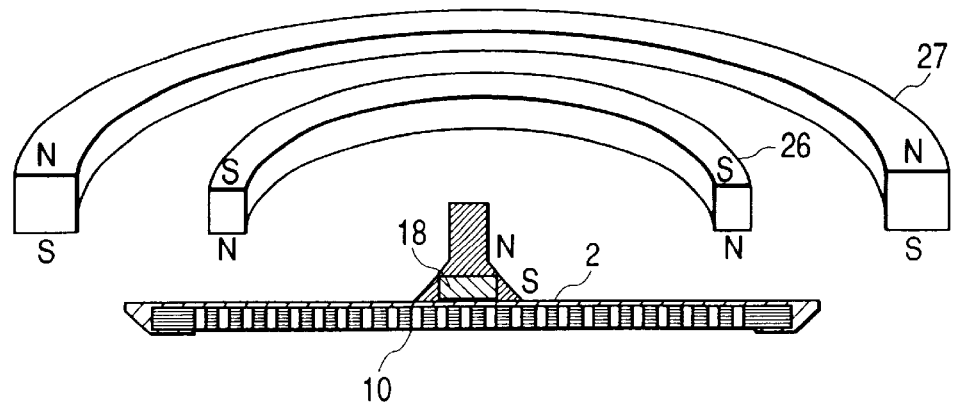

FIG. 9(a) and 9(b) show a plasma processing system according to Embodiment 5 of the invention. This embodiment has such a fundamental arrangement as Embodiment 3, and is characterized in a supply system of high frequency power applied to an antenna (i.e. planar plate 2).

A shown in FIG. 9(a), high frequency power for application to the planar plate 2 is branched from a biasing power supply 15 applied to the wafer and supplied to the planar plate 2 through a power distribution means 28. The permanent magnets 26, 27 are, respectively, arranged in a manner similar to Embodiment 3 as is particularly shown in FIG. 9(b).

According to the embodiment, a high frequency power supply for bias application to an antenna, a coil and a power supply for the coil are not necessary, and thus, a system arrangement of low costs becomes possible.

This embodiment may be applicable to Embodiment 4.

(Embodiment 6)

A method for manufacturing a semiconductor device using the plasma processing system of the invention is described with reference to FIGS. 10 to 12.

Figure 10:
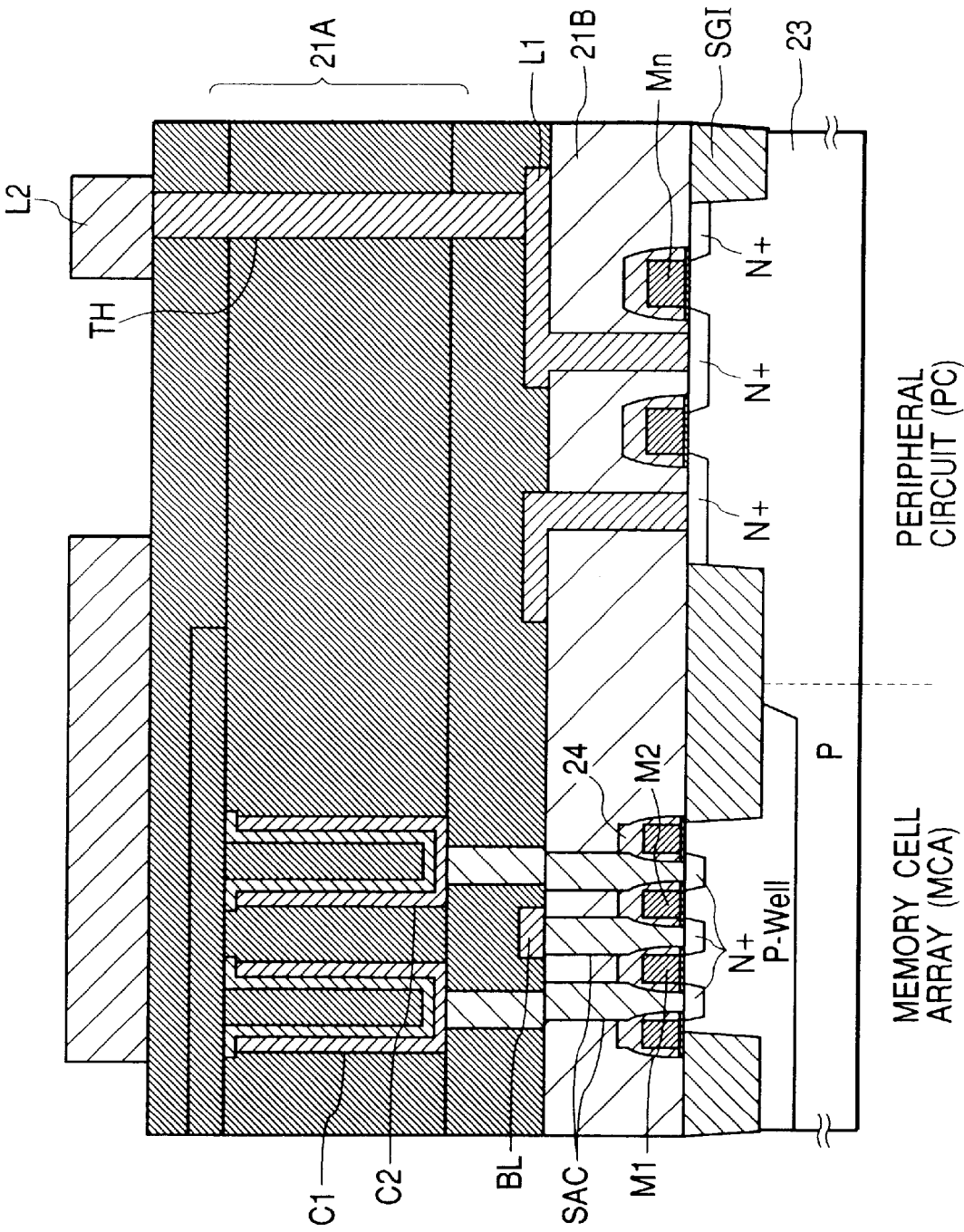
FIG. 10 is a sectional view showing a semiconductor device according to Embodiment 6 of the invention.

FIG. 10 is a view, in partial section, of a semiconductor device, typical of which is, for example, a 256 M bit dynamic random access memory. In FIG. 10, a p-type silicon semiconductor substrate 23 has a memory cell array (MCA) and a peripheral circuit (PC) formed on the main surface thereof. The memory cell array MCA has a plurality of cells, which are arranged in the form of an array and each of which consists of an N channel-type MOSFET M1 (M2) formed in a p-type well region (P-Well) and a capacitor C1 (C2) formed in a layer insulating film 21A. A bit line B is electrically connected to a $N^+$ common region (source drain region) of the MOSFET M1 (M2) between adjacent memory cells. The capacitor C1 (C2) is formed in a deep hole of the layer insulating film 21A positioned above the bit line BL so as to increase its capacitance. The peripheral circuit PC has a plurality of N-channel MOSFET's Mn. It will be noted that although not shown in the figure, a plurality of P-channel MOSFET's are arranged in this peripheral circuit and constitute CMOS circuits along with the N-channel MOSFET's Mn. The layer insulating film 21 has thereon an upper wiring layer L2 in the form of a pattern so as to connect the circuits therethrough.

The invention can be effectively applied to the formation of a through-hole TH having a high aspect ratio relative to the layer insulating film 21A, or the formation of a self-aligned contact hole SAC for the layer insulating film 21B.

Figure 11:
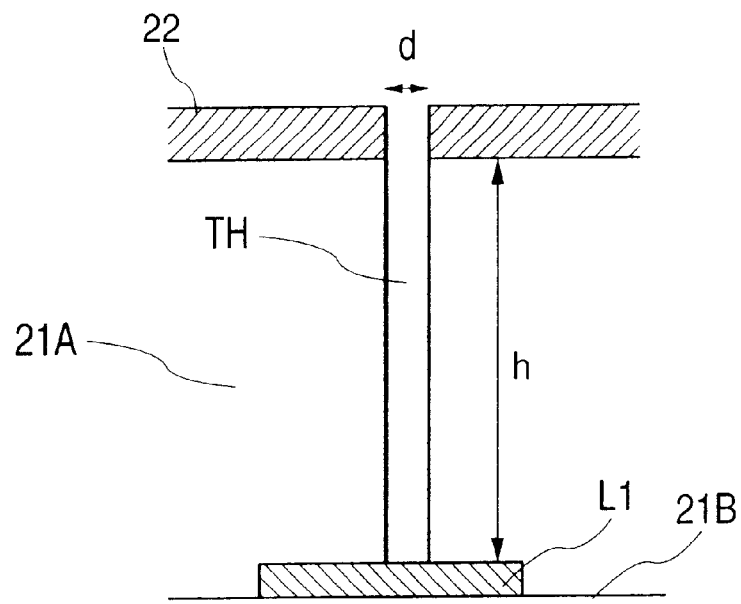
FIG. 11 is a schematic view, partially in section, showing a manufacturing step of a semiconductor device according to Embodiment 6 of the invention.

FIG. 11 is a partially sectional view illustrating an example of forming a through-hole TH shown in FIG. 10 by use of the plasma processing system shown, for example, in FIG. 1. A semiconductor wafer, on which a photoresist film 22 has been formed on a layer insulating film 12A in the form of a patter, is placed in the plasma processing system shown in FIG. 1. The layer insulating film 21A is selectively etched through the mask of the photoresist mask film 22 to form a through-hole TH of a high aspect ratio having a hole diameter (d) of 0.15 to 0.1 $\mu$m and a depth (h) of 1 to 3 $\mu$m so that part of a lower wiring layer L1 is exposed to.

According to this embodiment, the use of the plasma processing system shown in FIG. 1 enables one to etch the semiconductor wafer while reducing an in-plane variation of he wafer. More particularly, the variation in the etching between the central portion wafer and the peripheral portion of the semiconductor can be reduced. This contributes to the reduction in variation of etching among chips (IC units) and the improvement in yield of the manufacture of the semiconductor device.

The depth is a great factor for determining the processing time, and for processing to a depth of 2 $\mu$m or over, it is necessary to realize high-speed etching of 800 nm/minute or over. Otherwise, mass-production costs will increase. When using the method of he invention, it becomes possible to carry out high-speed etching at a rate of 800 to 1000 nm/minute. Thus, the manufacture of semiconductor devices at low costs can be realized.

After the step of forming the through-hole TH, a conductor plug P is formed in the through-hole TH as shown in FIG. 10. An upper wiring layer L2 connected to the conductor plug P is formed on the layer insulating film 21A in the form of a pattern.

In the practice of the invention, a self-aligned contact hole (SAC) is formed in the layer insulating film 21B, and a conductor film called a plug is buried in the self-aligned contact hole. The formation of the self-aligned contact hole (SAC) is now described.

Figure 12:
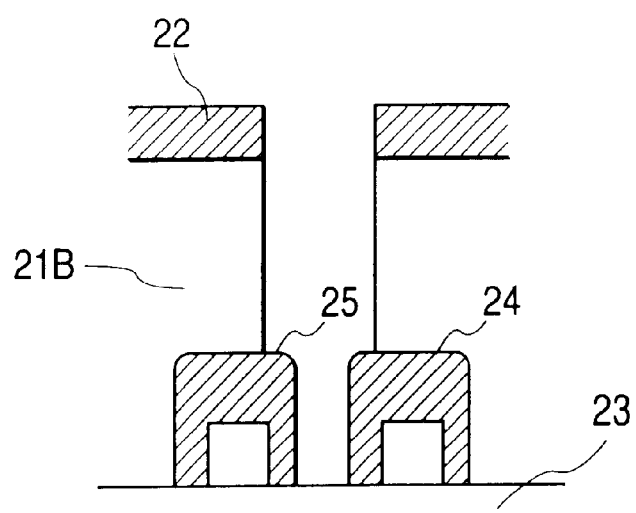
FIG. 12 is a schematic view, partially in section, showing another manufacturing step of a semiconductor device according to Embodiment 6 of the invention.

FIG. 12 is a partially sectional view illustrating an example of the formation of a self-aligned contact hole (SAC) by use of the plasma processing system shown in FIG. 1.

Using a mask of a patterned photoresist mask film 22, an oxide film (particularly, a silicon nitride film), on which the mask film has not been formed, is subjected to plasma etching to form a contact hole in the oxide film 22.

For the formation of SAC, it is required to form a contact in such a way that a shoulder 25 of a nitride film (particularly, a silicon nitride film) 24 at the bottom of the hole is not etched, and thus, it is important to improve etching selectivity of the oxide film (silicon oxide film) 21 relative to the shoulder 25 of the nitride film 24. The shoulder 25 of the nitride film 24 is liable to suffer an influence of physical sputtering in view of the shape thereof, and thus, a higher input energy of ions from the plasma results in poorer selectivity. On the other hand, when the input energy of the ions is lowered by the bias (high frequency power supply 15) applied to the wafer, the etching rate of the oxide film also lowers, resulting in the lowering of mass productivity. Therefore, in order to improve the selection ratio between the oxide film 21B and the shoulder 25 of the nitride film 24 without reducing the etching rate of the oxide film, it is effective to increase an ion current density, i.e. a plasma density. According to this embodiment, not only a high plasma density obtained, but also the uniformity in plasma density over the semiconductor wafer is enabled. Accordingly, in the formation of SAC shown in FIG. 12, the selection ratio between the oxide film 21B and the shoulder 24 of the nitride film 24 can be at 20 or over. Thus, the formation of SAC wherein a variation in etching among chips within the semiconductor wafer can be reduced. This leads to an improved yield of the manufacture of the semiconductor device.

As having set out hereinabove, according to the invention, there can be provided a parallel plate ECR plasma system wherein the interaction between the electromagnetic wave and the magnetic field under the planar plate is appropriately controlled whereby a substrate to be processed can be uniformly processed over a wide range of plasma conditions including a low density to a high density range capable of ensuring high-speed processing. In addition, this plasma processing system can be effectively applied to the manufacture of semiconductor devices or the like.

What is claimed is:

1. A plasma processing system using a parallel plate type electron cyclotron resonance comprising:

a processing mount for mounting a substrate to be processed in a processing container;

a planar plate capable of radiating an electromagnetic wave at a position in face-to-face relation with said substrate;

a shower plate provided in contact with one side of said planar plate;

a first magnetic field-forming means for forming a magnetic field, which is disposed at an outside or inside of said processing container so as to convert a given type of gas to a plasma by aid of the electromagnetic wave; and a second magnetic field-forming means provided with a magnet on the central portion of said planar plate at an opposite side to said one side contacting with said shower plate, for forming a magnetic field different from the magnetic field formed by the first magnetic field-forming means;

wherein a direction of a magnetic line of flux in the vicinity of said planar plate is controlled by combination of the magnetic field formed by said first magnetic field-forming means and the magnetic field formed by said second magnetic field-forming means.

2. A plasma processing system using a parallel plate type electron cyclotron resonance according to claim 1, wherein said first magnetic field-forming means is arranged in a region within ±50 mm of said planar plate in vertical directions and is capable of generating a magnetic field intensity that satisfies electron cyclotron resonance conditions relative to a frequency of said electromagnetic wave supplied to said planar plate.

3. A plasma processing system using a parallel plate type electron cyclotron resonance according to claim 1, wherein a direction of a magnetic line of flux of the magnetic field formed by said first magnetic field-forming means is distributed mainly from said planar plate toward a direction of said substrate to be processed.

4. A plasma processing system using a parallel plate type electron cyclotron resonance according to claim 1, wherein said second magnetic field-forming means is provided outside said processing container.

5. A plasma processing system using a parallel plate type electron cyclotron resonance according to claim 1, wherein said second magnetic field-forming means is constituted of a permanent magnet, a coil, or a combination thereof.

6. A plasma processing system using a parallel plate type electron cyclotron resonance according to claim 1, wherein said first magnetic field-forming means is constituted of a permanent magnet, a coil, or a combination thereof.

7. A plasma processing system using a parallel plate type electron cyclotron resonance according to claim 1, wherein the magnetic field formed by said second magnetic field-forming means has a polarity opposite to that of a magnetic field formed by said first magnetic field-forming means.

8. A plasma processing system using a parallel plate type electron cyclotron resonance according to claim 1, wherein said planar plate is applied with a high frequency of from 80 MHz to 500 MHz.

9. A plasma processing system using a parallel plate type electron cyclotron resonance according to claim 1, wherein the magnetic field formed by said second magnetic filed-forming means ranges from 50 to 600 gausses at a boundary between said planar plate and a plasma.

10. A plasma processing system using a parallel plate type electron cyclotron resonance according to claim 1, wherein said planar plate has a diameter that is 0.7 to 2 times the diameter of said substrate to be processed.

11. A plasma processing system using a parallel plate type electron cyclotron resonance according to claim 1, wherein a distance between said planar plate and said substrate to be processed ranges from 20 mm to 90 mm.

12. A plasma processing system using a parallel plate type electron cyclotron resonance according to claim 1, wherein a circular member that is made of one of silicon, silicon carbide, aluminum, aluminum oxide and quartz is provided around said substrate to be processed, and is applied with an electromagnetic wave that is branched from an electromagnetic wave applied to said substrate to be processed.

13. A plasma processing system using a parallel plate type electron cyclotron resonance according to claim 1, wherein a high frequency applied to said substrate to be processed differs in phase in the range of 160 degrees to 200 degrees from a high frequency branched from a high frequency applied to said substrate to be processed.

14. A plasma processing system comprising:

a processing mount for mounting a substrate to be processed in a processing container;

a planar plate capable of radiating an electromagnetic wave at a position in face-to-face relation with said substrate;

a first magnetic field-forming means for forming a magnetic field, which is disposed at an outside or inside of said processing container so as to convert a given type of gas to a plasma by aid of the electromagnetic wave;

a second magnetic field-forming means for forming a magnetic field different from the magnetic field formed by the first magnetic field-forming means;

wherein a direction of a magnetic line of flux in the vicinity of said planar plate is controlled by combination of the magnetic field formed by said first magnetic field-forming means and the magnetic field formed by said second magnetic field-forming means; and wherein said second magnetic field-forming means is formed on said planar plate.

15. A plasma processing system using a parallel plate type electron cyclotron resonance according to claim 14, wherein said first magnetic filed-forming means is arranged in a region within ±50 mm of said planar plate in vertical directions and is capable of generating a magnetic field intensity that satisfies electron cyclotron resonance conditions relative to a frequency of said electromagnetic wave supplied to said planar plate.

16. A plasma processing system using a parallel plate type electron cyclotron resonance according to claim 14, wherein a direction of a magnetic line of flux of the magnetic field formed by said first magnetic field-forming means is distributed mainly from said planar plate toward a direction of said substrate to be processed.

17. A plasma processing system using a parallel plate type electron cyclotron resonance according to claim 14, wherein said second magnetic field-forming means is provided outside said processing container.

18. A plasma processing system using a parallel plate type electron cyclotron resonance according to claim 14, wherein said second magnetic field-forming means is constituted of a permanent magnet, a coil, or a combination thereof.

19. A plasma processing system using a parallel plate type electron cyclotron resonance according to claim 14, wherein said first magnetic field-forming means is constituted of a permanent magnet, a coil, or a combination thereof.

20. A plasma processing system using a parallel plate type electron cyclotron resonance according to claim 14, wherein the magnetic field formed by said second magnetic field-forming means has a polarity opposite to that of a magnetic field formed by said first magnetic field-forming means.

21. A plasma processing system using a parallel plate type electron cyclotron resonance according to claim 14, wherein said planar plate is applied with a high frequency of from 80 MHz to 500 MHz.

22. A plasma processing system using a parallel plate type electron cyclotron resonance according to claim 14, wherein the magnetic field formed by said second magnetic filed-forming means ranges from 50 to 600 gausses at a boundary between said planar plate and a plasma.

23. A plasma processing system using a parallel plate type electron cyclotron resonance according to claim 14, wherein said planar plate has a diameter that is 0.7 to 2 times the diameter of said substrate to be processed.

24. A plasma processing system using a parallel plate type electron cyclotron resonance according to claim 14, wherein a distance between said planar plate and said substrate to be processed ranges from 20 mm to 90 mm.

25. A plasma processing system using a parallel plate type electron cyclotron resonance according to claim 14, wherein a circular member that is made of one of silicon, silicon carbide, aluminium, aluminium oxide and quartz is provided around said substrate to be processed, and is applied with an electromagnetic wave that is branched from an electromagnetic wave applied to said substrate to be processed.

26. A plasma processing system using a parallel plate type electron cyclotron resonance according to claim 14, wherein a high frequency applied to said substrate to be processed differs in phase in the range of 160 degrees to 200 degrees from a high frequency branched from a high frequency applied to said substrate to be processed.

27. A plasma processing system using a parallel plate type electron cyclotron resonance comprising:

a processing mount for mounting a substrate to be processed in a processing container;

a planar plate capable of radiating an electromagnetic wave at a position in face-to-face relation with said substrate to be processed;

a shower plate provided in contact with one side of said planar plate;

a magnetic field-forming means provided with a magnet for forming a magnetic field, which is disposed at an outside or inside of the processing container so as to convert a given type of gas to a plasma by aid of the electromagnetic wave; and means for controlling a direction, on said planar plate, of the magnetic field formed by said magnetic field-forming means, which depends on the magnitude and direction of an electric field vector of the electromagnetic wave formed on the surface of said planar plate at said one side contacting said shower plate, wherein the given type of gas is converted to a plasma for processing the substrate to be processed.

28. A plasma processing system according to claim 27, characterized in that said magnetic field-forming means is constituted of a plurality of ring-shaped permanent magnets concentrically provided on said planar plate.

29. A plasma processing system according to claim 28, characterized in that the plurality of ring-shaped permanent magnets that are concentrically provided are magnetized in vertical directions of the ring.

30. A plasma processing system according to claim 29, characterized in that the plurality of ring-shaped permanent magnets are alternately provided with respect to the direction of magnetization.

31. A plasma processing system using a parallel plate type electron cyclotron resonance comprising:

a processing mount for mounting a substrate to be processed in a processing container;

a planar plate capable of radiating an electromagnetic wave at a position in face-to-face relation with said substrate to be processed;

a shower plate provided in contact with one side of said planar plate;

a magnetic field-forming means provided with a magnet for forming a magnetic field, which is disposed at an outside or inside of the processing container so as to convert a given type of gas to a plasma by aid of the electromagnetic wave, and means for controlling a distribution of a magnetic field on the surface of said planar plate, depending on a distribution of an electric field of the electromagnetic wave on the surface of said planar plate at said one side contacting said shower plate, in such a way that an efficiency of generation of the plasma formed through the interaction of the electric field of the electromagnetic wave formed on the surface of said planar plate and the magnetic field formed by said magnetic field-forming means has a difference within ±20% in a region of not smaller than 50% of the entire surface of said planar plate, wherein the given type of gas is converted to a plasma, with which said substrate to be processed is processed.

32. A plasma processing system using a parallel plate type electron cyclotron resonance comprising:

a processing mount for mounting a substrate to be processed in a processing container;

a planar plate capable of radiating an electromagnetic wave at a position in face-to-face relation with the substrate to be processed;

a shower plate provided in contact with one side of said planar plate;

a magnetic field-forming means provided with a magnet for forming a magnetic field for generating a plasma by aid of the electromagnetic wave; and means for controlling a distribution of a magnetic field on the planar plate so that a produce of a sine of the angle, on the planar plate, between the electric field vector of the electromagnetic wave and the magnitude of the electric field vector of the electromagnetic wave formed on the surface of said planar plate at said one side contacting said shower plate has a difference within ±20% in a region of not smaller than 50% of the entire surface of said planar plate, wherein a given type of gas is converted to a plasma, with which said substrate to be processed is processed.

* * * * *